United States Patent
Nistler et al.

(10) Patent No.: US 7,847,554 B2
(45) Date of Patent: Dec. 7, 2010

(54) METHOD FOR CONTROLLING A MAGNETIC RESONANCE SYSTEM

(75) Inventors: Juergen Nistler, Erlangen (DE); Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 299 days.

(21) Appl. No.: 12/121,881

(22) Filed: May 16, 2008

(65) Prior Publication Data

US 2008/0284432 A1    Nov. 20, 2008

(30) Foreign Application Priority Data

May 18, 2007 (DE) .................. 10 2007 023 251

(51) Int. Cl.
*G01V 3/00* (2006.01)
(52) U.S. Cl. ..................... 324/318; 324/322
(58) Field of Classification Search .......... 324/318, 324/322
See application file for complete search history.

(56) References Cited

U.S. PATENT DOCUMENTS

| | | | |
|---|---|---|---|
| 5,818,231 A | 10/1998 | Smith | |
| 6,529,762 B1 | 3/2003 | Ladebeck | |
| 6,636,038 B1 | 10/2003 | Heid | |
| 6,900,636 B2 | 5/2005 | Leussler | |
| 6,906,518 B2 | 6/2005 | Leussler | |
| 6,952,097 B2 | 10/2005 | Schreck et al. | |
| 7,221,162 B2 | 5/2007 | Feiweier et al. | |
| 7,633,293 B2 * | 12/2009 | Olson et al. | 324/318 |
| 7,701,211 B2 * | 4/2010 | Katscher et al. | 324/318 |
| 7,701,213 B2 * | 4/2010 | Graesslin et al. | 324/318 |
| 2002/0087066 A1 | 7/2002 | Hellinger | |

* cited by examiner

*Primary Examiner*—Louis M Arana
(74) *Attorney, Agent, or Firm*—Schiff Hardin LLP (57) ABSTRACT

In a method for controlling a magnetic resonance system with a number of individually controllable transmission channels, a limited number of antenna control parameter sets are available that are associated with respective different examination situation classes that are defined with regard to specific examination situation parameters. The antenna control parameter sets include, for each of the transmission channels, a channel value or a channel value combination with which a relative amplitude and a relative phase of a radio-frequency signal emitted via the appertaining transmission channel are defined. Respective current examination situation parameter values to be associated with the examination situation parameters for the magnetic resonance measurement to be implemented are then detected and one of the examination situation classes is selected based on this. The magnetic resonance measurement is then implemented with the antenna control parameter set associated with the selected examination situation class.

18 Claims, 5 Drawing Sheets

METHOD FOR CONTROLLING A MAGNETIC RESONANCE SYSTEM

BACKGROUND OF THE INVENTION

1. Field of the Invention

The present invention concerns a method for controlling a magnetic resonance system for implementation of a magnetic resonance measurement in at least one specific volume region within an examination subject, wherein the magnetic resonance system has a radio-frequency antenna configuration with a number of individually controllable transmission channels for generation of radio-frequency fields in an examination volume surrounding the examination subject. The invention also concerns a method for generation of a collection of examination situation classes. Moreover, the invention concerns an antenna control device for implementation of such a control method as well as a magnetic resonance system with a corresponding antenna control device.

2. Description of the Prior Art

Magnetic resonance tomography is a technique for acquisition of images of the inside of the body of a living examination subject that has achieved widespread use. In order to acquire an image with this modality, the body or a body part of the patient or test subject to be examined must initially be exposed to an optimally homogeneous static basic magnetic field, which is generated by a basic field magnet of the magnetic resonance system. Rapidly switched gradient fields that are generated by gradient coils are superimposed on this basic magnetic field for spatial coding during the acquisition of the magnetic resonance images. Moreover, radio-frequency pulses of a defined field strength (known as the "$B_1$ field") are radiated into the examination subject with radio-frequency antennas. The nuclear spins of the atoms in the examination subject are excited by these radio-frequency pulses, such that they are deflected from the equilibrium state parallel to the basic magnetic field by what is known as an "excitation flip angle". The nuclear spins then precess around the direction of the basic magnetic field. The magnetic resonance signals thereby generated are acquired by radio-frequency acquisition antennas. The magnetic resonance images of the examination subject are generated on the basis of the acquired magnetic resonance signals.

To emit the required radio-frequency pulses in the patient positioning region, the tomography apparatus typically has an antenna structure permanently installed in the scanner housing. This radio-frequency antenna is also designated as a "body coil". It is formed (for example in the frequently used "birdcage structure") of a number of conductor rods arranged around the patient space and running parallel to the primary field direction, the conductor rods being connected with one another by ferrules at the facing ends of the coil. There also can be other antenna structures permanently installed in the housing (such as saddle coils, for example). Classical magnetic resonance systems essentially have only one transmission channel for emission of the $B_1$ field, meaning that there exists only one transmission line that leads from the radio-frequency amplifier to the antenna structure. Insofar as the antenna (such as, for example, birdcage antenna) is fashioned such that a circular polarized field can be emitted, the radio-frequency signal to be emitted (which arrives from the radio-frequency amplifier) is split by a hybrid module into two signals that are shifted opposite to one another by 90° in terms of their phase. The two signals are then fed via two transmission lines into the antenna structure at precisely defined connection points. The distribution of the $B_1$ field is permanently "frozen" by the division to the two transmission channels with the phases of 0° and 90° and cannot be adapted to the current conditions of the present measurement. Moreover, local coils also can be used that are arranged directly on the body of the patient. These coils have normally been used only as acquisition coils.

In particular in newer novel magnetic resonance systems with basic magnetic field strengths greater than three Tesla, considerable eddy currents are frequently induced in the patient upon radiation of the radio-frequency pulses. The actual homogeneously radiated $B_1$ field is consequently more or less strongly distorted. The influence of the patient body on the $B_1$ field is thereby dependent on, among other things, the stature (body type) of the patient and the proportions of the individual tissue types. For example, a very corpulent patient causes a circularly polarized magnetic field to be strongly distorted into an elliptical field. By contrast, this distortion is not so severe in thinner patients. In individual cases this can lead to the situation that a reliable magnetic resonance measurement is problematic in specific body regions of the patient and delivers unusable results.

In order to be able to influence the structure of the radiated magnetic field in a suitable manner with optimal detail in all regions of the examination volume, and in particular in order to achieve an optimally good homogeneity of the $B_1$ field in an examination volume by compensation of the possible distortions, local field corrections have previously been implemented by the use of (for example) dielectric cushions.

Individual adjustments of the amplitude values and the phase values of the radio-frequency pulse emitted by each transmission channel are presently under discussion as a further promising approach for homogenization of the $B_1$ field. The spatial distribution of the $B_1$ field can thereby be influenced with the goal of generating an optimally homogeneous radio-frequency field in the examination subject, or in the examination volume with consideration of the field distortions to be expected. One design is the use of a number of separately controllable antenna elements. An example of this technique is explained in DE 101 24 465 A 1, which describes an antenna with a number of separately controllable antenna elements. For this purpose, each transmission channel has a separate antenna element. Moreover, various feed lines connected to the overall antenna structure (for example the aforementioned two feed lines to a birdcage structure for emission of a circularly polarized field) can also be supplied via individually controllable transmission channels.

An unsolved problem exists in determining the antenna control parameter values for the individual transmission channels in a fast and simple manner so that the desired $B_1$ distribution is achieved in the patient or at least in the area of interest (region of interest, ROI) for the present acquisition. An adjustment known as a static $B_1$ adjustment is presently implemented in such apparatuses to determine the parameters. Such adjustments, however, are extraordinarily time-consuming and therefore are not very suitable in practice in many cases.

SUMMARY OF THE INVENTION

An object of the present invention is to provide capability to determine a sufficiently good antenna control parameter set for a planned magnetic resonance measurement in an uncomplicated and fast manner.

According to the inventive method, a limited number of different antenna control parameter sets is initially provided that are respectively associated with various examination situation classes that are defined with regard to specific examination situation parameters. An antenna control parameter set for an examination signal class for each of the transmission channels includes a channel value or a channel value combination with which the relative amplitude and the relative phase of a radio-frequency shield emitted by the appertaining transmission channel are defined. The channel values or the channel values combination for a transmission channel can thereby be direct amplitude values and phase values that establish the amplitude and the phase of the radio-frequency shields at the appertaining transmission channel relative to the other transmission channels. As an alternative to the use of direct amplitude values and phase values, the channel values or channel values combinations can represent the real part and the imaginary part of a complex coefficient to describe the radio-frequency signal in the respective transmission channel, with a conversion between amplitude and phase, and real part and imaginary part, is possible in a known manner at any time.

Detection or identification of current examination situation parameter values associated with the examination signal parameters for the respective magnetic resonance measurement to be implemented initially ensues in the preparation of a current magnetic resonance measurement. One of the examination situation classes is selected for the current measurement on the basis of the detected current examination situation parameter values, meaning that the examination situation class is sought which best matches the respective examination situation.

The implementation of the desired magnetic resonance measurement subsequently ensues with the antenna control parameter set associated with the selected examination situation class. For this purpose, a radio-frequency signal (for example a radio-frequency pulse sequence generated in a typical manner for the desired measurement) is fed into the radio-frequency antenna structure via the individual transmission channels in parallel with the amplitudes and phases of the antenna control parameter set that are associated with the appertaining transmission channels.

The inventive method is based on the insight that, for implementation of a magnetic resonance measurement, a completely free adjustment capability of the individual transmission channels is not necessary in order to achieve a clear improvement of the $B_1$ field distribution in the examination subject; rather, it is sufficient when the examination situation of the present measurement is respectively associated with an examination situation class into which all examination situations with specific common or similar examination situation parameter values fall, and the antenna control parameter sets predetermined beforehand for the associated examination situation class are used for a current examination. The method for implementation of a magnetic resonance measurement is simplified and accelerated by the simple class association since the magnetic resonance system can directly acquire the settings for current examination situations (for example from a look-up table). In the application of the method, the number of the steps and thus the time to adjust a desired $B_1$ field thus can be clearly reduced. Since a sufficient improvement of the $B_1$ field can also be achieved in this manner with fewer discretely switchable field configurations, the additional hardware expenditure is slight.

An antenna control device according to the invention for controlling the radio-frequency antenna structure with a number of individually controllable transmission channels requires a data source to provide a number of different antenna control parameter sets that are associated with respective different examination situation classes which are defined with regard to specific examination situation parameters. An antenna control parameter set includes a respective channel value or a channel values combination for an examination situation class for each of the transmission channels, with which respective channel value or channel values combination a relative amplitude and a relative phase of a radio-frequency signal emitted by the appertaining transmission channel are respectively defined. The data source can be, for example, a memory or a memory region of a memory of the magnetic resonance system in which the antenna control parameter sets for the various examination situation classes are stored. For example, it can also be a reader with an exchangeable storage medium on which the data are stored or an interface via which the appertaining data sets can be retrieved from remote memories or apparatuses via the network.

Furthermore, the inventive antenna control device has an interface for detection or identification of current examination situation parameter values associated with the examination situation parameters for the magnetic resonance measurement that is to be implemented. The interface can be, for example, an operating terminal at the magnetic resonance system that is connected with the antenna control device and the memory for input of patient data such as name, age, weight, etc. Alternatively, the interface can establish a connection to a network which, for example, connects magnetic resonance system to the patient admission system of the clinic in which the magnetic resonance system is located. Furthermore, the interface can establish a connection to an automatic image evaluation system of magnetic resonance images in order to obtain current examination situation parameter values, as described in further detail in the following.

A further significant component of the inventive antenna control device is a class selection unit that serves for selection of one of the examination situation classes based on the detected examination situation parameter values.

The method can be used in magnetic resonance systems of different designs. It is merely required that an inventive magnetic resonance system have a suitable transmission antenna and a number of transmission channels and a previously described antenna control device in order to supply the transmission antenna with radio-frequency signals via the individual transmission channels according to the inventive method.

The class selection unit and possibly also parts of the interface and/or of the data source can be in the form of one or more software modules, which can be installed in a computer-supported control device of the magnetic resonance system. As used herein, be a "computer-supported control device" means a control device equipped with a suitable processor as well as further components in order to execute the provided control, measurement and/or evaluation programs. A largely software-based realization has the advantage that existing magnetic resonance systems can also be upgraded or retrofitted more easily with an inventive control device.

Examination situation parameters in the context of the invention can in principle encompass all parameters that describe the examination situations and in particular have a relevant influence on the $B_1$ field. Patient type-specific parameters and examination type-specific parameters preferably belong among the examination situation parameters. Patient type-specific parameters are, for example, the age, the gender, the height, the weight, etc. of the patient to be examined, as well as further features pertaining to the stature of the patient, i.e. whether he or she is slender, muscular or corpulent, for example. For example, the body region to be examined and the examination type or the clinical question (i.e. whether it is a head examination, a torso examination or an examination of individual extremities, for example), whether contrast agents are used as well as possible further information about the examination are among the examination type-specific parameters. For example, the position of the patient on the patient bed can be among to the examination type-specific parameters, for example whether the leg is bent or extended given a knee examination. For some examination situation parameters there are only discrete parameter values such as the parameter values "male" or "female" for the examination parameter "gender", for example. By contrast, there are corresponding parameter value ranges for other examination situation parameters such as, for example, the weight or the age.

According to the invention, various antenna control parameter sets must be provided for the various examination situation classes. This means that a collection of examination situation classes with associated antenna control parameter sets must initially be generated with this method before an implementation of magnetic resonance measurements and be stored in a memory in a suitable manner (for example in a database).

There are different possibilities for establishment of the examination situation classes. It should be ensured that the various examination situations which act similarly in terms of influence identically on the $B_1$ field distribution are in the same examination situation class. An optimal use of the predetermined antenna control parameter sets for a measurement to be implemented thus can be ensured.

In the simplest case, a hierarchical classification of the examination situations into classes and sub-classes can ensue. For example, respective classes for the examinations of the various body regions such as head examination, torso examination, examination of various extremities etc. can initially be formed. Two sub-classes for adults and children and/or sub-classes for specific head sizes are then formed for the examination situation class "head". For example, three sub-classes "male", "female" and "child" (which again possess weight-dependent sub-classes, for example) are defined for the examination situation class "torso" etc. Such a classification can be conducted very quickly.

In another preferred exemplary embodiment, the definition of the various examination situation classes ensues using examination situation clusters that were determined on the basis of a number of training examination situations.

The examination situation parameter values belonging to the examination situation parameters can be respectively determined for the individual training examination situations to determine the examination situation clusters. The training examination situations are then grouped with regard to these examination situation parameter values.

For example, the examination situation parameters can thus span a multi-dimensional feature space. A feature vector that characterizes the appertaining training examination situation with regard to the examination situation parameters is then respectively formed from the examination situation parameter values of the individual training examination situations. The training examination situations can be arranged in a multi-dimensional feature space (feature domain) in this manner. Specific spatially contiguous clusters that form the examination situation clusters can then be formed using a defined interval measure. Typical cluster methods can be used for this purpose.

A weighting of the examination situation parameters is also possible; examination situation parameters carry stronger weight the stronger their influence on the radio-frequency field distribution.

For the individual training examination situations, the $B_1$ field distortions can also be determined and used as primary or additional examination situation parameter values for the cluster process, meaning that the formation of the examination situation classes then directly ensues on the basis of the $B_1$ field distortions generated in the individual examination situations. Instead of the $B_1$ field distortions, the antenna control parameter sets that were necessary in the respective training examination situation in order to achieve a desired $B_1$ field distribution (for example a homogeneous $B_1$ field) can also be used as examination situation parameter values. An examination situation class formation implemented in this manner has the advantage that reasonable antenna control parameter sets for the examination situation classes thus can already be established.

Training examination situations that represent a representative random sampling of all typical examination situations are preferably used for the determination of the examination situation clusters. The various examinations for specific body parts or, respectively, body regions (such as, for example, head examinations, torso examinations, etc. on the different patient types) count among these. Examination situations for examination types that are not considered at all in specific patient groups naturally do not need to be considered at all. For example, prostate examinations are not conducted on women and children; breast examinations are conducted only on women.

Real examinations conducted on patients are advantageously used as training examination situations. For example, examinations on patients can be recorded by various clinics and practices or in testing centers of the manufacturer of the magnetic resonance system, and the data required for the formation of examination situation classes can be transmitted to the manufacturer of the magnetic resonance system or another service provider. The manufacturer or service provider evaluates the examinations and generates the examination situation classes. These can be supplied to the users of the magnetic resonance systems according to the invention. If required, specific examinations can be additionally conducted on test subjects in order to be able to take into account a number of possible examination situations. The clinics or practices can also subsequently deliver further data of training examination situations. Additional or improved examination situation classes with the associated antenna control parameter sets can be offered as updates based on these data, for example for download from a network or on a data medium.

The antenna control parameter sets are advantageously selected for the individual examination situation classes such that a specific (normally optimally homogeneous) radio-frequency field distribution is achieved in an examination situation to be associated with the appertaining examination situation class.

Since the antenna control parameter sets predetermine the relative amplitudes and phases for the respective transmission channels, it is required that respective examination situation classes with the associated matching antenna control parameter sets are generated for each antenna type with a specific number of transmission channels.

In a preferred embodiment of the method, only a limited number of adjustable relative amplitudes and a limited number of adjustable relative phases are available to form the respective channel value or the respective channel value combination. This means that a broader value range is not available for definition of the respective channel value or of the respective channel value combination, but rather only a few selected, discrete values. For example, discrete factors such as 0.5, 1.0, 1.5, etc. for the amplitude and discrete values of 60°, 90°, 120°, etc. for the phase can be set. Since only the relative values of the transmission channels among one another are adjusted, in principle a factor of 1 for the amplitude and a phase shift of 0° can thereby also be set for one of the transmission channels, meaning that the radio-frequency signal for this transmission channel remains unchanged.

Given the specification of the amplitude values and of the phase values a limitation is advantageously also possible in order to regulate specific effects such as, for example, the loading of the individual components or a local SAR (Specific Absorption Rate). It can therefore be ensured that specific exposure limits are not exceeded and locally determined SAR limit values are complied with.

Separate circuit units can then be used in the antenna control device to adjust the values for amplitude and phase of the respective transmission channel corresponding to the predetermined channel values or channel value combination.

In a preferred embodiment, the antenna control device has a signal splitter that apportions a radio-frequency signal to be emitted to the respective transmission channels. Damping and/or amplification elements for variation of the amplitude of a radio-frequency signal sent via the respective transmission channel (which damping and/or amplification elements are downstream from the signal splitter) can then be used in the individual transmission channels. Delay elements can be used to delay the phase of a radio-frequency signal sent via the respective transmission channel. As an alternative, conductors respectively having defined different lengths can be used.

When suitable antenna control parameter sets for the various examination situation classes are present, an essential point in the implementation of a magnetic resonance measurement is the selection of the suitable examination situation class which best matches the current examination situation. According to the invention, this selection ensues on the basis of current examination situation parameter values.

In a preferred method for selection of one of the examination situation classes on the basis of the detected current examination situation parameter values, parameter values or value ranges respectively determined for specific examination situation parameters are associated with the individual examination situation classes. The defined parameter values or the defined value ranges enable the best suited examination situation class to be selected, for example via a simple comparison of the determined current examination situation parameter values with the defined parameter values or value ranges. Given a hierarchical class structure, the examination situation parameter values can thereby be used corresponding to the hierarchy.

Alternatively, a range in a multi-dimensional feature space spanned by the examination situation parameters can also be established again for each examination situation class, for example, and then using the examination situation parameter values of the current examination situation it can be checked in which range (i.e. in which examination situation class) said examination situation falls. In the borderline case, for example, the distance from a center point or focal point of the examination situation classes in feature space can be taken into account.

The determination of the examination situation parameter values necessary for the classification of the current magnetic resonance measurement can ensue in different ways:

Some of the parameter values for the current examination (such as, for example, the gender, the age or the weight of the patient) are normally already manually input in advance upon the patient admittance into the clinic or are imported from a chip card or the like and thus are already available. A further portion of the examination situation parameter values (such as, for example, the examination region) can be input by the operator of the magnetic resonance system before the examination. At least one part of the current examination situation parameter values can likewise be determined using a magnetic resonance examination of the examination subject, for example via the evaluation of a pre-scan. A pre-scan is for the most part conducted anyway to produce an overview exposure in order to establish the precise region of the examination. Examination situation parameter values such as the position, the height, the stature and further data about the body structure of the patient can thereby be determined via a relatively simple analysis of the images. This can advantageously occur with the aid of an automatic image processing unit.

In a preferred embodiment of the antenna control device, the class selection unit required for the selection of the suitable examination situation class is fashioned such that it automatically determines the examination situation class on the basis of the detected current examination situation parameter values. This means that the class selection unit compares the detected current examination situation parameter values with the parameter values or the value range of the examination situation class and thus automatically determines the examination situation class best suited for this examination situation. Alternatively, the automatically determined examination situation class is initially output via an operator interface for verification by an operator. It then is up to the discretion of the operator to conduct the measurement or possibly to effect an adjustment with corresponding assistive means (such as, for example, dielectric cushions or similar elements) in a different manner in order to improve the homogeneity within the measurement volume.

DESCRIPTION OF THE PREFERRED EMBODIMENTS

As explained in the preceding, in a magnetic resonance measurement the radiated radio-frequency fields can be severely distorted by the patient. For example, a circularly polarized radiated magnetic field can be distorted into an elliptical field. In order to achieve a homogeneous $B_1$ field, given magnetic resonance examination systems with a number of separately controllable transmission channels the possibility exists in principle to compensate these distortions by a superimposition of multiple similar $B_1$ signals shifted relative to one another in phase and amplitude.

The time-dependent $B_1$ field $B_{1,ges}(t)$ of a simple magnetic resonance system with two transmission channels $H_1$ and $H_2$ can thus be described as follows:

$$B_{1,ges}(t) = K_{H1}(t) \cdot B_{1,H1}(t) + K_{H2}(t) \cdot B_{1,H2}(t) \quad (1)$$

$B_{1,H1}(t)$ and $B_{1,H2}(t)$ are the respective identical radio-frequency signals emitted in parallel via the two transmission channels. $K_{H1}(t)$ and $K_{H2}(t)$ are complex, time-dependent coefficients that, according to $$K_{H1}(t) = A_{H1}(t) e^{j\phi_{H1}(t)} \quad (2a)$$

$$K_{H2}(t) = A_{H2}(t) \cdot e^{j\phi_{H2}(t)}, \quad (2b)$$

describe the phase shifts $\phi_{H1}(t)$, $\phi_{H2}(t)$ and the amplitude modification $A_{H1}(t)$, $A_{H2}(t)$ to which the radio-frequency signals $B_{1,H1}(t)$ and $B_{1,H2}(t)$ are subjected upon emission via the transmission channels $H_1$, $H_2$. The amplitude values $A_{H1}(t)$, $A_{H2}(t)$ and the phase values $\phi_{H1}(t)$, $\phi_{H2}(t)$ are also designated as channel values in the following. Together the values for a transmission channel respectively form a channel value combination for the appertaining transmission channel $H_1$, $H_2$, and that channel value combination forms an antenna control parameter set. A description of the complex, time-dependent coefficients $K_{H1}(t)$ and $K_{H2}(t)$ can alternatively also ensue via corresponding specification of the real portions and imaginary portions of the coefficients.

Depending on the design of the antenna, the individual field portions $K_{H1}(t) \cdot B_{1,H1}(t)$ and $K_{H2}(t) \cdot B_{1,H2}(t)$ of the radio-frequency signal that are manipulated in such a manner then superimpose either within the antenna structure or in the examination volume after an emission by the individual antenna elements.

The aforementioned field distortion is, among other things, strongly dependent on the respective examination situation, in particular the stature of the patient. The channel values must therefore be respectively adapted to the examination situation, for which a time-consuming adjustment is typically implemented. Surprisingly, it has been established that an entirely free adjustment capability of the channel values of the individual transmission channels is not necessary in the overwhelming number of cases in order to achieve a distinct improvement of the $B_1$ field distribution in the examination subject. According to the invention, a method is therefore used in which an antenna control parameter set with suitable channel values is respectively established in advance for specific classes of examination situations. Using current examination parameter values it is then established into which of the examination situation classes the current examination situation falls, and the measurement is then implemented with the associated antenna control parameter set.

Figure 1:
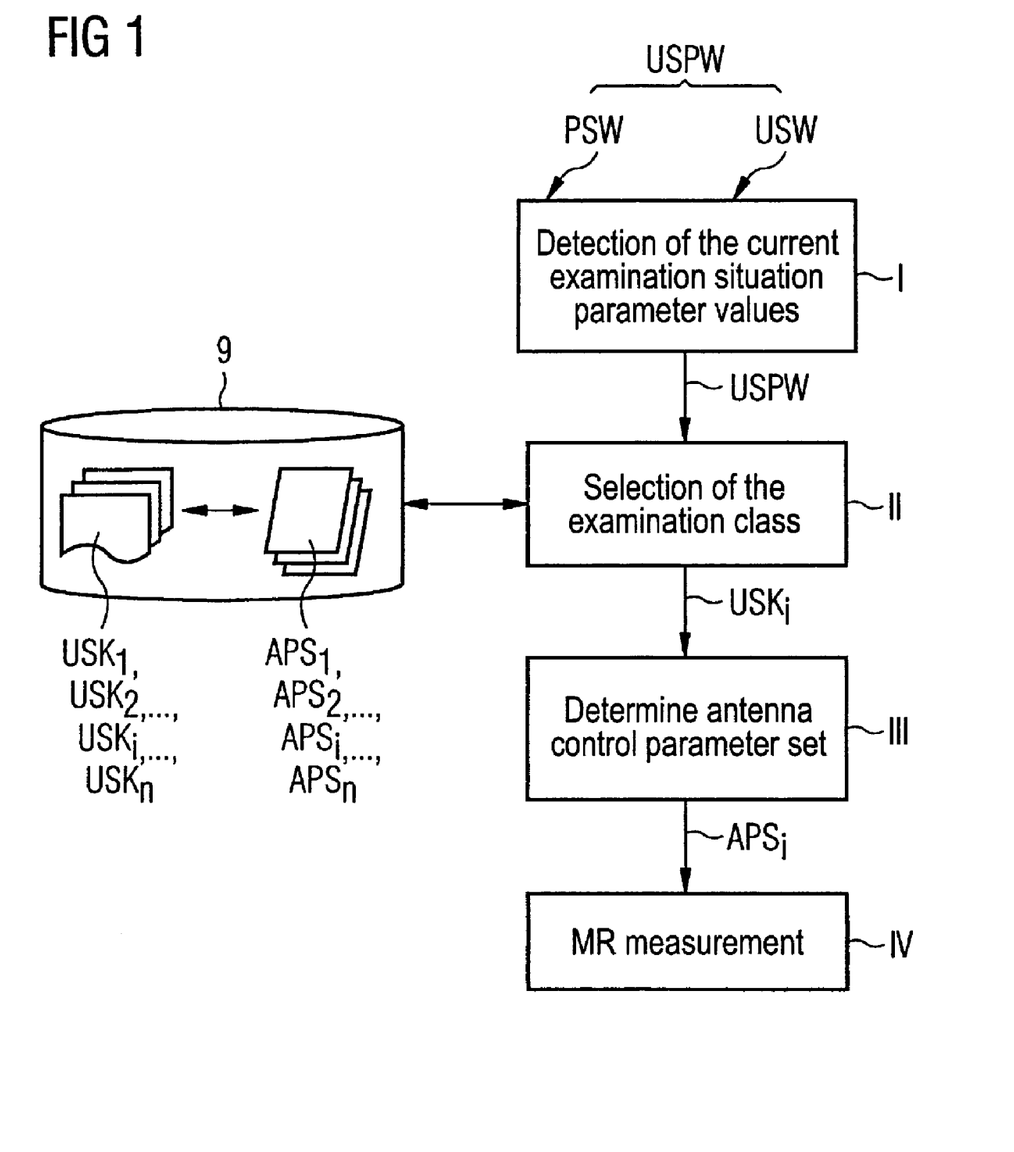
FIG. 1 is a flowchart for presentation of a possible workflow of the inventive method for implementation of a magnetic resonance measurement.

A possible workflow of the inventive method for selection of the examination situation classes USK and of the associated antenna control parameter sets APS for implementation of a magnetic resonance measurement is subsequently explained with the aid of FIG. 1 by means of a flowchart.

The current examination situation parameter values USPW are initially recorded in step I. Patient type-specific parameter values PSW such as, for example, the gender, the height, the weight and the age of the patient belong among these. The patient type-specific parameter values PWS are advantageously already recorded upon the patient admittance into the clinic or practice. Moreover, examination type-specific parameter values USW (such as, for example, the type of the examination and the position of the patient etc.) that are, for example, input by the appropriate personnel immediately before the magnetic resonance measurement or can also be acquired in part from a pre-scan (as this is explained further later) belong among the examination situation parameter values USPW.

The selection of the examination class USK best suited for this examination situation then ensues in a next step II on the basis of these examination situation parameter values USPW.

In the particularly simple method variant already mentioned above, this can ensue with a hierarchical classification of the examination situations such that specific parameter values or value ranges are respectively predetermined for specific examination situation parameters USP, according to which specific parameter values or value ranges the sorting of the current examination situation into one of the classes ensues on the respective hierarchical level.

A simple comparison of the determined current examination situation parameter values USPW with the predefined parameter values or value ranges is sufficient for this.

The following table shows a very simplified example of this:

| USK | Examination situation parameter: parameter values | | A | $\phi$ |
|---|---|---|---|---|
| 1 | Head region: | Head | 2.0 | 60° |
| 2 | Body region: | Torso | 1.5 | 90° |
|   | Height: | 150 cm to 170 cm | | |
|   | Weight: | >100 kg | | |
| 3 | Body region: | Torso | 2.0 | 120° |
|   | Height: | 150 cm to 170 cm | | |
|   | Weight: | 50 kg to 70 kg | | |
| 4 | Body region: | Torso | ... | ... |
|   | Height: | <150 | | |
|   | ... | | | |
| ... | Body region: | ... | ... | ... |
| n | Body region: | ... | ... | ... |
|   | ... | | | |

The first column is the examination situation class USK specified with a specific number. The second column indicates according to which examination situation parameters the classification occurs and into which associated examination situation parameter values or, respectively, into which parameter value ranges a concrete examination situation in this class falls.

Here the examination situation parameter in the uppermost hierarchy level is the respective body region to be examined. There is only one examination situation class USK=1 for the body region "head". Depending on the height (second hierarchy level) and weight (third hierarchy level), there are various examination situation classes USK for the body region "torso".

However, a selection of the examination situation classes USK can alternatively also ensue according to a different method, for example as already explained above via formation of a multi-dimensional feature vector for the current examination situation and association with one of many examination situation classes.

An associated antenna control parameter set $APS_i$ is now determined in step III using the selected examination situation class $USK_i$ (i=1, ..., n).

For this purpose, a relative amplitude factor A and a relative phase $\phi$ are already specified in the table for the individual examination situation classes USK. This would in principle suffice for a system with two transmission channels since the variation of the field distribution due to the superimposition of two partial signals according to equation (1) depends only on the channel values relative to one another. This means that, in the stationary case equation (1) can then be written simplified as:

$$B_{1,ges} = K \cdot B_{1,H1} + B_{1,H2} \qquad (3)$$

wherein $$K = A \cdot e^{j\phi}. \qquad (4)$$

This means that it is sufficient when the proportion of the radio-frequency signal at the transmission channel $H_1$ experiences a variation of the amplitude and/or of the phase while the other part of the radio-frequency signal at the transmission channel $H_2$ is passed nearly unchanged. The relative amplitude factor A in the table thereby indicates by which factor the signal amplitude should be higher in the first transmission channel $H_1$ than in the second transmission channel $H_2$. This can be achieved either by an amplification in the first transmission channel $H_1$ or an attenuation in the second transmission channel $H_2$. The relative phase φ indicates by which value the phase of the signal portion should be shifted at the first transmission channel $H_1$ relative to the second transmission channel $H_2$, which is achieved via a corresponding delay in the first or second transmission channel.

In many cases an improvement of the MR measurements can already be achieved with the very simple exemplary embodiment shown using the table. A corresponding table can be stored in a database in a memory 9 of the system. It can be seen that the table contains a number of further examination situation classes in reality. The finer the sub-division of the classes, the more precisely that the system can compensate the distortions, wherein the total number of classes should be kept within certain limits in order to not lose the advantage of the fast adjustment.

The antenna control parameter set APSI selected for the current examination situation is then used in step IV for implementation of the desired magnetic resonance measurement.

Figure 2:
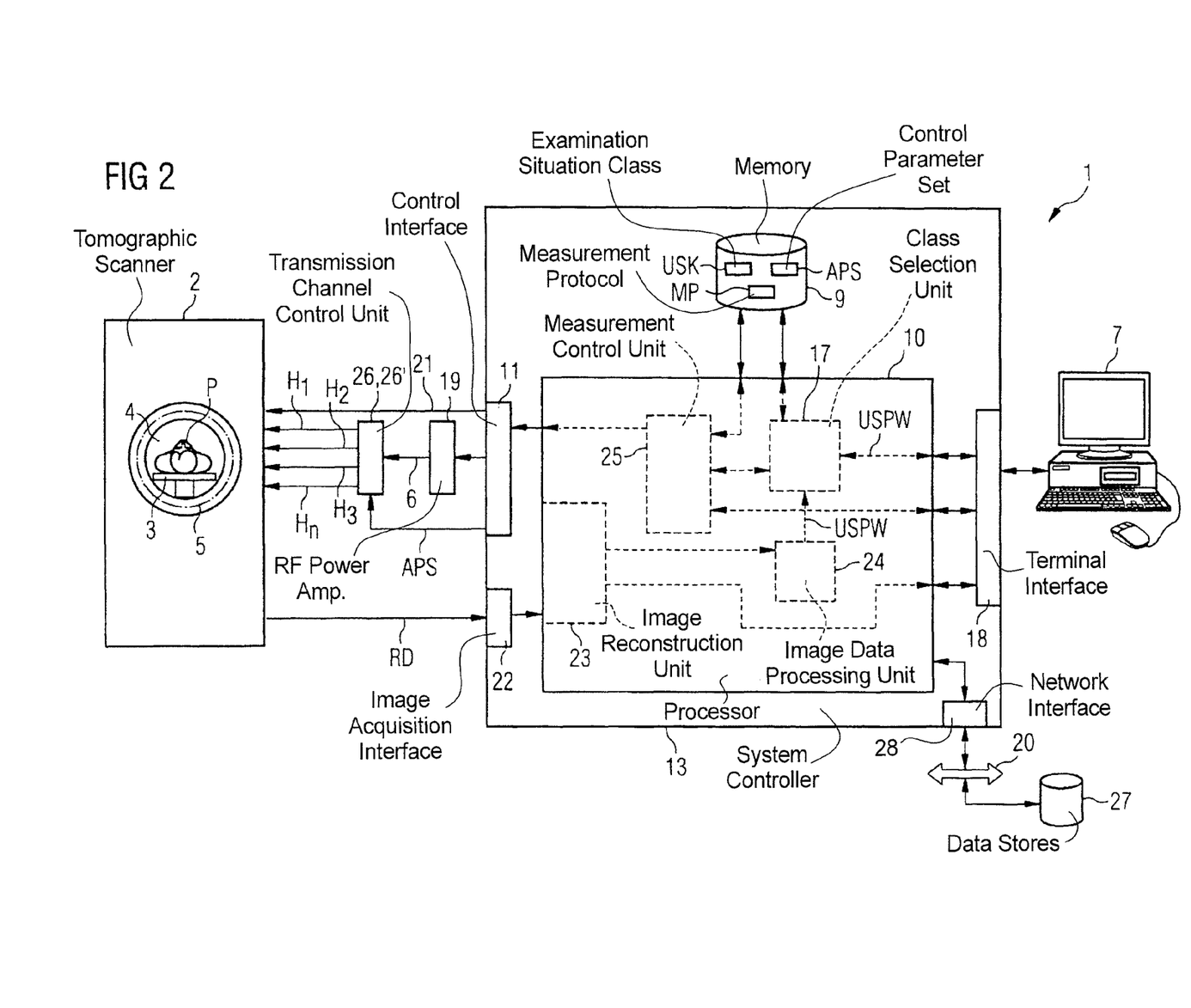
FIG. 2 is a basic block diagram of an exemplary embodiment of a magnetic resonance system according to the invention.

FIG. 2 shows a basic block diagram for an exemplary embodiment of a magnetic resonance system 1 with which the inventive method can be implemented.

The core of this magnetic resonance system 1 is a tomographic scanner 2 in which a patient P is positioned on a bed 3 in a cylindrical examination volume 4. A radio-frequency antenna structure 5 annularly surrounding the examination volume 4 for emission of radio-frequency pulses is located within the scanner 2. The scanner 2 is of known construction, apart from the capability to be able to control the antenna structure 5 via a number of separate transmission channels $H_1, H_2, \ldots, H_n$ or antenna feed lines, and need fulfill no particular additional requirements for the implementing inventive method.

The scanner 2 is controlled by a system controller 13. A terminal 7 (operator console) via which an operator operates the system controller 13 and with it the scanner 2, is connected to the system controller 13 via a terminal interface 18. The system controller 13 is connected with the scanner 2 via a tomograph control interface 11 and an image acquisition interface 22. The corresponding control commands are output via the scanner control interface 11 to the scanner 2 and a radio-frequency supply arrangement 19, 26, 26' so that the desired pulse sequences (i.e. the radio-frequency pulses and the gradient pulses) are emitted. The raw data are acquired (i.e. the acquired signals are read out) via the image data acquisition interface 22.

A central component in the system controller 13 is a processor 10 in which various control components are realized in the form of software. It should be noted that such a system controller 13 can naturally also have a number of processors networked with one another on which the various control components are realized, for example in the form of program modules.

Such a component is a measurement control unit 25 with which the user can communicate via the terminal 7. This measurement control unit 25 controls the scanner 2 via the control interface 11 and thus ensures the emission of the desired radio-frequency pulse sequences by the radio-frequency antenna structure 5 and furthermore that the gradients are switched in a suitable manner in order to implement the desired measurements. The measurement control unit 25 receives the specifications for the emission of the radio-frequency pulse sequences and the gradient pulse sequences in a typical manner in the form of measurement protocols MP that are stored in a memory 9 and can be altered by the operator, for example.

The raw data RD acquired via the image acquisition interface 22 are relayed to a further component (an image reconstruction unit 23) realized on the processor 10, which component correspondingly processes the raw data RD. The image reconstruction unit 23 provides for a Fourier transformation of the raw data RD and for a reconstruction of images. The generated image data can also be stored in the memory 9 of the system controller 13, for example.

Both the system controller 13 and the terminal 7 can also be integral components of the scanner 2. The entire magnetic resonance system 1, moreover, has all further typical components or features such as (for example) interfaces for connection via a network interface 28 to a communication network 20 that, for example, is connected with an image information system (PACS, Picture Archiving and Communication System) or offers connection possibilities for external data stores 27. These components are not all represented in FIG. 1 for better clarity.

The inventive magnetic resonance system 1 has a class selection unit 17 as an additional component of the system controller 13 according to the invention. This is likewise realized in the form of software on the processor 10. The class selection unit 17 determines the best suited examination situation class USK based on the current examination situation parameter values USPW for the current examination situation. The class selection unit 17 receives the required current examination situation parameter values USPW in part via the terminal interface 18 in which the examination situation parameter values USPW are input by the operator at the operator terminal 7. Data already acquired by other units of the clinic or practice can also be adopted as further examination situation parameter values USPW via the communication network 20.

Moreover, downstream from the image reconstruction unit 23 is an image data processing unit 24 that, among other things, prepares pre-scans and provides them to the operator, for example on the operator terminal 7 via the terminal interface 18. Additional examination situation parameter values USPW, for example data about the fat content in the body of the patient, are thereby automatically acquired from the pre-scans. These can likewise be used for the selection of the best suited examination situation class USK and are passed as further examination situation parameter values USPW to the class selection unit 17.

The associated antenna control parameter set APS stored in the memory 9 is then determined for the determined examination situation class USK and passed to the measurement control device 25. The measurement control device 25 transmits the antenna control parameter set APS via the scanner control interface 11 to a transmission channel control unit 26, 26' of the radio-frequency supply arrangement.

Figure 3:
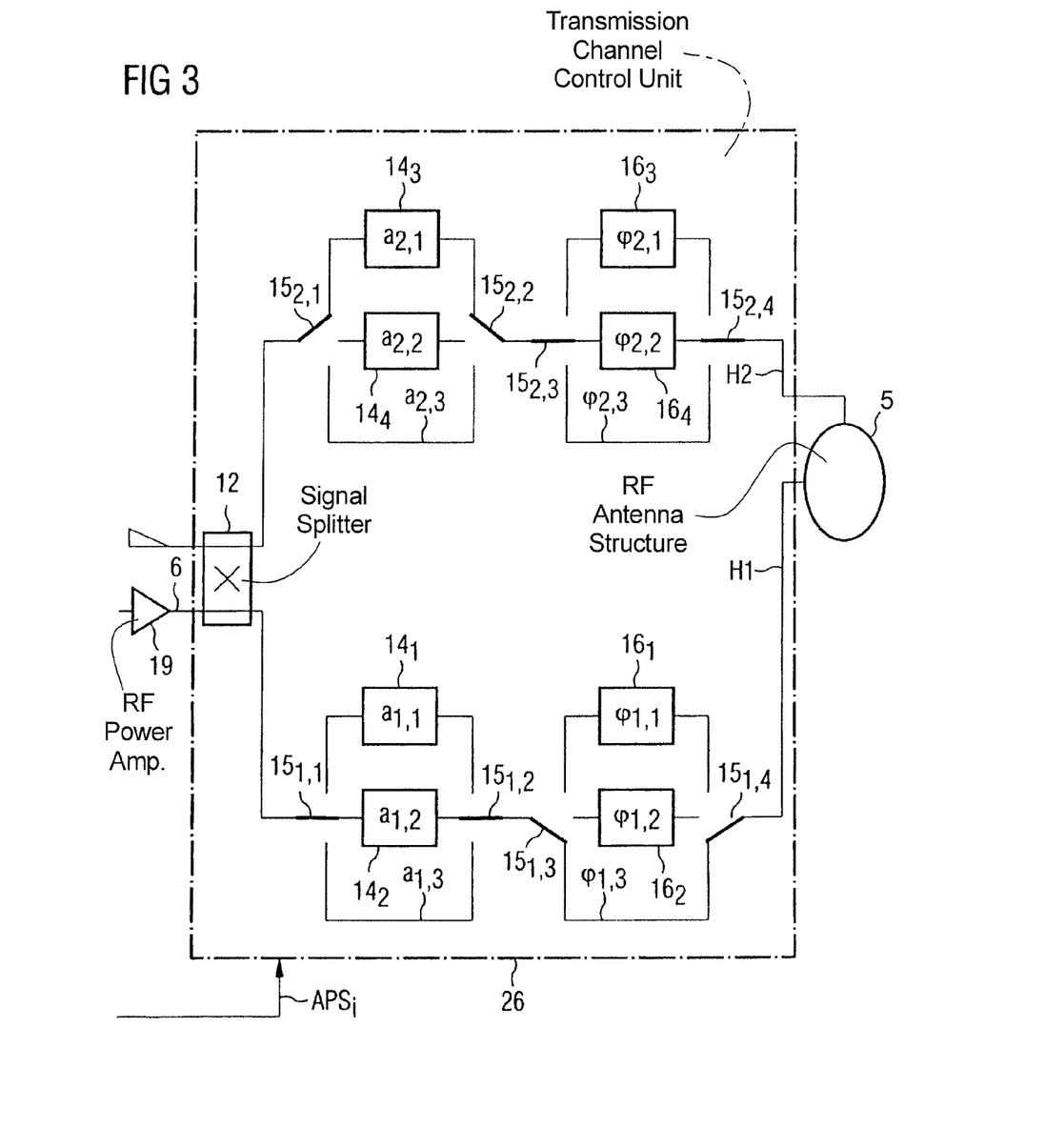
FIG. 3 is a basic block diagram of a first exemplary embodiment of a transmission channel control unit for an inventive magnetic resonance system with two transmission channels.
Figure 4:
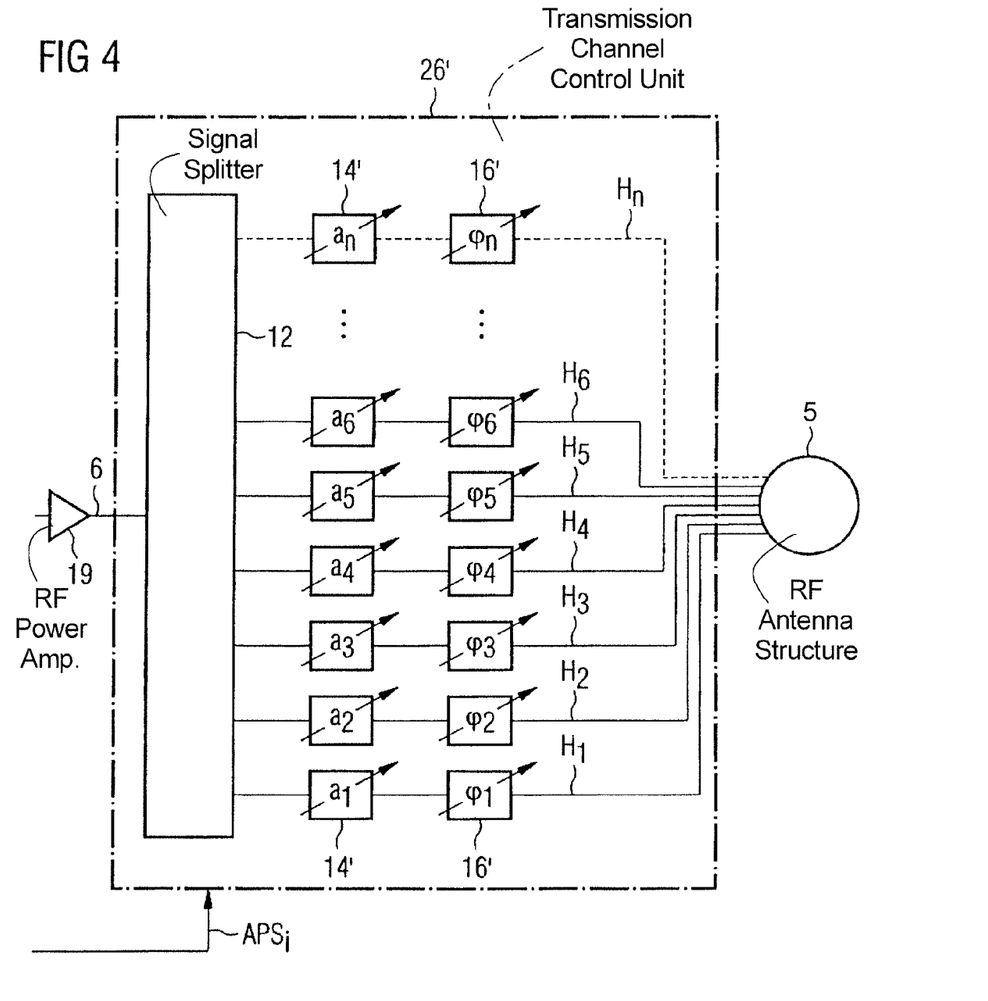
FIG. 4 is a basic block diagram of a second exemplary embodiment of a transmission channel control unit for an inventive magnetic resonance system with a plurality of transmission channels.

The radio-frequency signal or the sequence of radio-frequency pulses required according to the measurement protocol is generated at the matching strength by a radio-frequency power amplifier 19 of the radio-frequency supply arrangement and then is divided up by the transmission channel control unit 26, 26' into n transmission channels $H_1, H_2, \ldots, H_n$, which is explained further using FIGS. 3 and 4. The transmission channel control unit 26, 26' thereby controls the individual transmission channels $H_1, H_2, \ldots, H_n$ corresponding to the predetermined antenna control parameter set APS.

In this regard, FIG. 3 shows as a simple exemplary embodiment a transmission channel control unit 26 with two separately controllable transmission channels $H_1, H_2$.

The radio-frequency signals 7 predetermined by the measurement protocol MP are generated at the desired strength in the radio-frequency power amplifier 19 and are split up into two advantageously equally large partial signals for the present transmission channels $H_1, H_2$ via a downstream signal splitter 12 of the transmission channel control unit 26. The partial signals are then manipulated corresponding to the above equations (1), (2a) and (2b) with regard to their amplitude and phase.

For this purpose each of the two transmission channels $H_1$, $H_2$ is provided with a group with two hard-set (fixed) attenuation elements $14_1$, $14_2$, $14_3$, $14_4$ in order to attenuate the signal amplitude of the signal portion coming via the appertaining transmission channel $H_1$, $H_2$ by a specific attenuation factor $a_{2,1}, a_{2,2}, a_{1,1}, a_{1,2}$. One of the attenuation elements $14_1$, $14_2$, $14_3$, $14_4$ can alternately be switched into the appertaining transmission channel $H_1$, $H_2$ via switches $15_{2,1}, 15_{2,2}, 15_{1,1}, 15_{1,2}$. Moreover, the attenuation elements $14_1$, $14_2$, $14_3$, $14_4$ can respectively be bridged via a simple conductor section whose attenuation factors $a_{2,3}, a_{1,3}$ are respectively approximately equal to 1, meaning that the partial signal is passed unchanged here.

A group with two hard-set delay elements $16_1$, $16_2$, $16_3$, $16_4$ with the phase shifts $\phi_{2,1}, \phi_{2,2}, \phi_{1,1}, \phi_{1,2}$ that can be correspondingly optionally activated by means of switches $15_{2,3}, 15_{2,4}, 15_{1,3}, 15_{1,4}$ are respectively provided wired in series with the attenuation elements $14_1$, $14_2$, $14_3$, $14_4$ in the transmission channels $H_1$, $H_2$. The delay elements $16_1$, $16_2$, $16_3$, $16_4$ can respectively be bridged via a simple conductor section, the phase shift $\phi_{2,3}, \phi_{1,3}$ of which is defined only by the conductor length in order to pass the partial signal nearly without phase shift.

The fixed base setting of the attenuation elements $14_1$, $14_2$, $14_3$, $14_4$ and of the delay elements $16_1$, $16_2$, $16_3$, $16_4$ advantageously ensues upon placing the magnetic resonance system 1 into operation. Amplification elements to amplify the signal amplitude can alternatively also be used instead of the attenuation elements $14_1$, $14_2$, $14_3$, $14_4$.

The radio-frequency signal portions so manipulated for each transmission channel $H_1$, $H_2$ are subsequently transferred to the radio-frequency antenna 5. With the design according to FIG. 3, nine different combinations can respectively be set in a simple manner for the relative amplitude values of the two partial signals at the two transmission channels $H_1$, $H_2$. Nine different combinations can likewise be respectively set for the relative phase values. Overall 81 different setting possibilities result in order to adjust the superimposed total signal to various examination situations.

FIG. 4 shows an exemplary embodiment for a transmission channel control unit 26' with more than two separately controllable transmission channels $H_1, H_2, \ldots, H_n$.

As in the variant according to FIG. 4, a radio-frequency power amplifier 19 provides for a radio-frequency signal 6 at a suitable strength. This is divided up via a downstream signal splitter 12 into n partial signals (advantageously again of equal size) corresponding to the number of the present transmission channels $H_1, H_2, \ldots, H_n$. Attenuation elements 14' and delay elements 16' for the variation of the amplitude values and phase values are in turn arranged in each of the transmission channels $H_1, H_2, \ldots, H_n$.

The attenuation elements 14' and delay elements 16' can be individually adjusted in this exemplary embodiment. This means that each attenuation element 14' can be set to specific, discrete values for attenuation of the amplitude, for example. Amplification elements that comprise an expanded adjustment range (for example from an attenuation up to an amplification of the signal amplitude) can alternatively be used instead of the attenuation elements. Each delay element 16' likewise offers the possibility to set discrete values for the phase shift.

The radio-frequency signal portions influenced correspondingly to the settings of the attenuation elements 14' and delay elements 16' in the respective transmission channels $H_1, H_2, \ldots, H_n$ are subsequently transferred to the radio-frequency antenna structure 5 where they form the pre-distorted radio-frequency field as requested by their superimposition.

In order to be able to implement the inventive method, it is necessary that a collection of suitable examination situation classes USK with antenna control parameter sets ASP are provided, for example by the manufacturer of the magnetic resonance system 1 for the appertaining magnetic resonance system 1 with the specific radio-frequency antenna structure 5 and the determined number of transmission channels $H_1, H_2, \ldots, H_n$.

Figure 5:
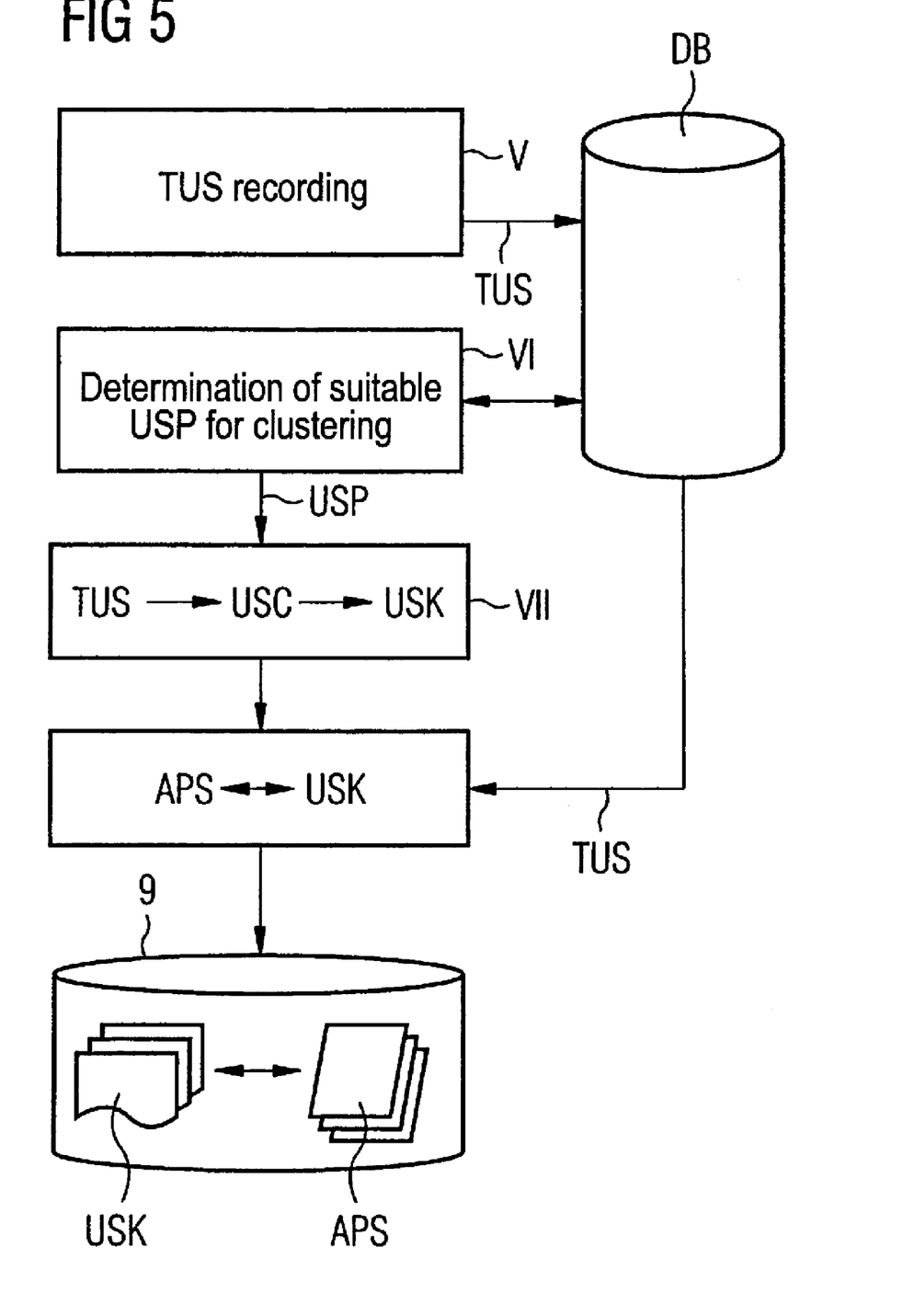
FIG. 5 is a flowchart for presentation of a possible workflow of the inventive method for determination of a collection of examination situation classes and associated antenna control parameter sets.

FIG. 5 shows, in the form of a flow chart, the workflow of a possible variant of the inventive method for determination of a suitable collection of examination situation classes USK and the associated antenna control parameter sets APS.

A recording of training examination situations TUS initially ensues in step V. These training examination situations TUS can, for example, be real examinations already conducted on patients in clinics, practices or even in testing centers. These training examination situations TUS are stored in a database DB with all significant associated examination situation parameter values as well as advantageously with the antenna control parameter sets (i.e. the channel values or channel value combinations) set for the respective examination situation. This recording of training examination situations TUS can ensue over a longer time span. It is only necessary that a suitable collection of relevant training examination situations TUS with the required data is available.

In a next step VI the training examination situations TUS stored in the database are then evaluated with regard to the examination situation parameters USP and examined with regard to features that would be suitable for a classification of the examination situations into examination situation classes USK such as, for example, the height and the age of the patient P or the position of the patients or of body parts of the patient in the examination. This step VI is required only in a first development of suitable examination situation classes USK. Insofar as a classification of suitable examination situation parameters USP is already established from previous classifications or for another reason, step VII can immediately proceed.

The examination situation parameter values USPW belonging to the selected examination situation parameters ISP are now respectively determined for the individual training examination situations TUS in step VII. The training examination situations TUS are then clustered with regard to these examination situation parameter values USPW. A possible method for this was described in detail above. The examination situation clusters USC thereby obtained respectively represent an examination situation class USK.

The association of suitable antenna control parameter sets APS with the examination situation classes USK ensues in a further step VIII.

For this the antenna control parameter sets set in the respective training examination situations TUS can advantageously be resorted to in the described method. Namely, a suitable antenna control parameter set APS for this examination situation class USK can then be determined from the channel values or, respectively, channel value combinations which were sent in the training examination situations TUS from which the appertaining examination situation class USK was formed. For example, an average value can be determined from all channel values or channel value combinations of the training examination situations TUS of this examination situation class USK.

The examination situation classes USK are finally stored in a data memory 9 together with the antenna control parameter sets APS and can be retrieved for future examinations (see FIG. 2).

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for controlling a magnetic resonance system to implement a magnetic resonance measurement of at least one specific volume region within an examination subject, said magnetic resonance system comprising a radio-frequency antenna structure with a plurality of individually controllable transmission channels that are controlled to radiate a radio-frequency field into the specific volume region, said method comprising the steps of:
    providing a limited number of different antenna control parameter sets that are respectively associated with different examination situation classes that are respectively defined by respective examination situation parameters, each antenna parameter control set for an examination class comprising, for each of said transmission channels, a channel value or a channel value combination that defines a relative amplitude and a relative phase of a radio-frequency signal emitted by that transmission channel;
    identifying current examination situation parameter values for a current magnetic resonance magnetic resonance measurement to be implemented using said magnetic resonant system;
    selecting one of said examination situation classes dependent on the detected current examination situation parameter values; and
    implementing said magnetic resonance measurement using an antenna control parameter set that is associated with the selected examination situation class by feeding radio-frequency signals in parallel from said transmission channels into said radio-frequency antenna structure with respective amplitudes and phases in the respective channels according to the antenna control parameter set that is associated with the selected examination situation class.

2. A method as claimed in claim 1 comprising formulating said current examination situation parameters as patient type-specific parameters and examination type-specific parameters.

3. A method as claimed in claim 2 comprising defining the different examination situation classes using examination situation clusters that are determined from a plurality of training examination situations.

4. A method as claimed in claim 3 comprising determining the examination situation parameter values that are respectively associated with the examination situation parameters to define an examination situation cluster for respective training examination situations, and grouping the training examination situations dependent on the examination situation parameter values.

5. A method as claimed in claim 4 comprising employing training examination situations respectively for determining the examination situation cluster that represent a random sample of typical examination situations in magnetic resonance measurements.

6. A method as claimed in claim 1 comprising associating the antenna control parameter sets with respective examination situation classes to cause a specified radio-frequency field distribution to be generated in the respective examination situations associated with the examination situation classes.

7. A method as claimed in claim 1 comprising defining each antenna control parameter set from a limited plurality of adjustable relative amplitudes and a limited plurality of adjustable relative phases.

8. A method as claimed in claim 1 comprising selecting said one of said examination situation classes dependent on correspondence of the detected current examination situation parameter values with parameter values or value ranges that are respectively determined for specific examination situation parameters associated with the respective examination situation classes.

9. A method as claimed in claim 1 comprising determining at least a portion of the current examination situation values by implementing a magnetic resonance measurement of the examination subject.

10. A method for generating a collection of examination situation classes for implementation of a magnetic resonance measurement of at least one specific volume region within an examination subject, using a magnetic resonance system comprising a radio-frequency antenna structure with a plurality of individually controllable transmission channels that are controlled to radiate a radio-frequency field into the specific volume region, said method comprising the steps of:
    providing a limited number of different antenna control parameter sets that are respectively associated with different examination situation classes that are respectively defined by respective examination situation parameters, each antenna parameter control set for an examination class comprising, for each of said transmission channels, a channel value or a channel value combination that defines a relative amplitude and a relative phase of a radio-frequency signal emitted by that transmission channel; and
    electronically storing said parameter sets in a memory in a storage form allowing retrieval from said memory of the respective parameter sets by identification of the examination situation class associated therewith.

11. An antenna control device for a magnetic resonance system for implementation of a magnetic resonance system to implement a magnetic resonance measurement of at least one specific volume region within an examination subject, said magnetic resonance system comprising a radio-frequency antenna structure with a plurality of individually controllable transmission channels that are controlled to radiate a radio-frequency field into the specific volume region, said antenna control device comprising:
- a data source that provides a limited number of different antenna control parameter sets that are respectively associated with different examination situation classes that are respectively defined by respective examination situation parameters, each antenna parameter control set for an examination class comprising, for each of said transmission channels, a channel value or a channel value combination that defines a relative amplitude and a relative phase of a radio-frequency signal emitted by that transmission channel;
- an interface that detects current examination situation parameter values for a current magnetic resonance magnetic resonance measurement to be implemented using said magnetic resonant system;
- a class selection unit that selects one of said examination situation classes dependent on the detected current examination situation parameter values; and
- a processor configured to implement said magnetic resonance measurement using an antenna control parameter set that is associated with the selected examination situation class by feeding radio-frequency signals in parallel from said transmission channels into said radio-frequency antenna structure with respective amplitudes and phases in the respective channels according to the antenna control parameter set that is associated with the selected examination situation class.

12. An antenna control device as claimed in claim 11 comprising a signal splitter that apportions the radio-frequency signal emitted to the antenna structure among the respective transmission channels.

13. An antenna control device as claimed in claim 11 wherein each transmission channel has an associated element selected from the group consisting of attenuation elements and amplification elements that modifies the amplitude of the respective radio-frequency signal in that transmission channel.

14. An antenna control device as claimed in claim 11 comprising, in each of said transmission channels, a delay element that adjusts the phase of the radio-frequency signal in that transmission channel.

15. An antenna control device as claimed in claim 11 wherein said class selection unit is configured to automatically determine the examination situation class dependent on the detected current examination situation parameter values.

16. An antenna control device as claimed in claim 15 wherein said control device is configured to automatically emit an identification of the determined examination situation class as a humanly perceptible output, and requiring a manual verification of the determined examination situation class, via an operator interface, before implementing said magnetic resonance measurement.

17. A magnetic resonance system for implementing a magnetic resonance measurement of at least one specific volume region within an examination subject, comprising:
- a radio-frequency antenna structure with a plurality of individually controllable transmission channels that are controlled to radiate a radio-frequency field into the specific volume region; and
- an antenna control device comprising a data source that provides a limited number of different antenna control parameter sets that are respectively associated with different examination situation classes that are respectively defined by respective examination situation parameters, each antenna parameter control set for an examination class comprising, for each of said transmission channels, a channel value or a channel value combination that defines a relative amplitude and a relative phase of a radio-frequency signal emitted by that transmission channel, an interface that detects current examination situation parameter values for a current magnetic resonance magnetic resonance measurement to be implemented using said magnetic resonant system, a class selection unit that selects one of said examination situation classes dependent on the detected current examination situation parameter values, and a processor configured to implement said magnetic resonance measurement using an antenna control parameter set that is associated with the selected examination situation class by feeding radio-frequency signals in parallel from said transmission channels into said radio-frequency antenna structure with respective amplitudes and phases in the respective channels according to the antenna control parameter set that is associated with the selected examination situation class.

18. A computer-readable medium encoded with programming instructions for operating a control device of a magnetic resonance system to implement a magnetic resonance measurement of at least one specific volume region within an examination subject, said magnetic resonance system comprising a radio-frequency antenna structure with a plurality of individually controllable transmission channels that are controlled to radiate a radio-frequency field into the specific volume region, said control device having access to a limited number of different antenna control parameter sets that are respectively associated with different examination situation classes that are respectively defined by respective examination situation parameters, each antenna parameter control set for an examination class comprising, for each of said transmission channels, a channel value or a channel value combination that defines a relative amplitude and a relative phase of a radio-frequency signal emitted by that transmission channel, and said control device also having access to current examination situation parameter values for a current magnetic resonance magnetic resonance measurement to be implemented using said magnetic resonant system, said programming instructions causing said processor to:
- select one of said examination situation classes dependent on the detected current examination situation parameter values; and
- implement said magnetic resonance measurement using an antenna control parameter set that is associated with the selected examination situation class by feeding radio-frequency signals in parallel from said transmission channels into said radio-frequency antenna structure with respective amplitudes and phases in the respective channels according to the antenna control parameter set that is associated with the selected examination situation class.

* * * * *